US005973863A

United States Patent [19]

Hatasawa et al.

[11] Patent Number: 5,973,863

[45] **Date of Patent: *Oct. 26, 1999**

[54] EXPOSURE PROJECTION APPARATUS

[75] Inventors: Masato Hatasawa, Yokohama; Masatoshi Ikeda, Tokyo, both of Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/908,949

[22] Filed: Aug. 8, 1997

[30] Foreign Application Priority Data

Aug. 8, 1996 [JP] Japan .................................... 8-225872

[51] Int. Cl.[6] ...................................................... G02B 7/02

[52] U.S. Cl. .......................... 359/823; 359/822; 359/637; 359/827; 359/738; 355/30; 355/53; 250/201.2

[58] Field of Search .................................... 359/823, 824, 359/822, 826, 637, 619, 622, 827, 738; 356/375; 355/30, 52, 53, 77; 250/201.2

[56] References Cited

U.S. PATENT DOCUMENTS

| | | | |
|---|---|---|---|
| 4,387,970 | 6/1983 | Brueggemann | 359/813 |
| 4,629,313 | 12/1986 | Tanimoto | 356/375 |
| 4,699,505 | 10/1987 | Komoriya et al. | 355/30 |
| 4,965,630 | 10/1990 | Kato et al. | 355/52 |
| 5,105,075 | 4/1992 | Ohta et al. | 250/201.2 |
| 5,117,255 | 5/1992 | Shiraishi et al. | 355/53 |
| 5,307,207 | 4/1994 | Ichihara | 359/622 |
| 5,311,362 | 5/1994 | Matsumoto et al. | 359/738 |
| 5,534,970 | 7/1996 | Nakashima et al. | 359/622 |
| 5,583,696 | 12/1996 | Takahashi | 359/637 |
| 5,638,223 | 6/1997 | Ikeda | 359/827 |

FOREIGN PATENT DOCUMENTS

| | | |
|---|---|---|
| 7-086152 | 3/1995 | Japan . |
| 2138163 | 10/1984 | United Kingdom . |

*Primary Examiner*—Loha Ben
*Attorney, Agent, or Firm*—Morgan, Lewis & Bockius LLP

[57] ABSTRACT

The exposure projection apparatus includes an illumination system which illuminates a mask with a light beam, and a optical projection system which projects the image of a pattern formed on the mask onto a substrate. The optical projection system includes a first barrel which holds a plurality of optical elements, at least three second barrels, each holding at least one optical element disposed between the mask and the first barrel, so that the coma, astigmatism, and distortion of the optical projection system can be adjusted, and a first optical element which is disposed between the substrate and the first barrel so that either the spherical aberration or curvature of field of the optical projection system, or both, can be adjusted.

23 Claims, 7 Drawing Sheets

EXPOSURE PROJECTION APPARATUS

This application claims the benefit of Japanese Patent Application No. 08-225872 filed Aug. 8, 1996, which is hereby incorporated by reference.

BACKGROUND OF THE INVENTION

1. Field of the Invention

The present invention is directed towards an exposure projection apparatus, which is employed in lithographic processes to manufacture microdevices such as semiconductor elements, liquid crystal display elements, thin-film magnetic heads, and imaging elements (CCD's), etc., and specifically is directed towards an optical projection apparatus for projecting device patterns onto a photosensitive substrate.

2. Related Background Art

Exposure projection apparatuses used in lithographic processes for manufacturing semiconductor devices are equipped with optical projection systems in which numerous lens elements are mounted inside a barrel. FIG. 7 shows the structure of an optical projection system used in a conventional exposure projection apparatus.

In the optical projection system 80 shown in FIG. 7, a plurality of lens elements 82 are accommodated inside a barrel 81. The plurality of lens elements 82 are held by respective lens cells 84 inside the single barrel 81, and are arranged along an optical axis AX. In order to allow adjustment of the respective positions of the plurality of lens elements inside the barrel 81, e.g., the positions of the first through fourth lens elements as seen from the upper end (reticle R end) of the barrel, along the direction of the optical axis AX, the lens cells 84 that holds these four lens elements are supported by respective spacing adjustment washers 86. A retainer 85 is screwed into the top part of the barrel 81, so that retainer 85 presses against the lens frame 84 located closest to the reticle R. As a result, the plurality of lens cells 84 are respectively fastened in place inside the barrel 81.

However, in an exposure projection apparatus, it may be necessary to make corrections for various aberrations in the optical projection system in response to changes in the working environment. In order to make such corrections it is necessary to alter the spacing of at least two of the plurality of lens elements 82. In the case of the optical projection system shown in FIG. 7, however, it is impossible, due to structural limitations, to alter the spacing of at least two of the plurality of lens elements 82 from outside of the barrel 81 after the optical projection system has been assembled. Accordingly, in order to alter the spacing of at least two of a plurality of lens elements 82, it is necessary to disassemble the optical projection system 80. This involves removing the optical projection system 80 from the exposure projection apparatus, removing the retainer 85 from the barrel 81, removing at least one lens frame 84 from the barrel, and replacing or removing one or more space adjustment washers 86. Accordingly, the time required to disassemble and assemble the optical projection system in order to make adjustments for aberrations becomes problematic. An additional problem also arises in that after the optical projection system, which has been adjusted for an aberration, has been reassembled inside the exposure projection apparatus the positional adjustment and alignment of the optical projection system must be performed once again.

In U.S. Pat. No. 5,117,255, hereby incorporated by reference, a technique is disclosed in which the spacing of several lens elements in a optical projection system is altered in order to correct for superimposition error caused by image distortion in cases where different patterns are superimposed on a wafer using a plurality of exposure projection apparatuses. The spacing of the lens elements is adjusted by supporting a plurality of lenses close to the reticle by means of respective piezoelectric-elements and driving the piezoelectric-elements along the optical axis of the optical projection system.

In recent years, as a result of the increased precision requirements of circuit patterns in semiconductor elements, it has become necessary to achieve ideal imaging by making high-precision adjustments for various types of aberrations in optical projection systems. Furthermore, various aberrations in optical projection systems change according to changes in the reticle pattern and exposure conditions (e.g., size and shape of the secondary light source). Accordingly, there is a need for a mechanism which makes it possible to adjust the spacing of the lens elements in a optical projection system in accordance with the exposure conditions without disassembly of the optical projection system.

Accordingly, in U.S. patent application Ser. No. 08/302,477, filed Sep. 12, 1994, now abandoned, the present Applicants disclosed an exposure projection apparatus in which a) at least one optical element is accommodated in each of a plurality of barrel units; and b) the plurality of barrel units are designed so that these units can be freely attached and detached from the optical projection system, thus allowing easy adjustment of the optical performance values (e.g., magnification, distortion, etc.) of the optical projection system.

SUMMARY OF THE INVENTION

A first aspect of the present invention is to provide an exposure projection apparatus, which can be used in lithographic processes of device manufacturing, capable of manufacturing microdevices such as semiconductor elements, liquid crystal display elements, thin-film magnetic heads and imaging elements (CCD's), etc., with a high degree of precision.

A second aspect of the present invention is to provide an exposure projection apparatus, which can project pattern images onto a substrate under favorable imaging conditions at all times.

A third aspect of the present invention is to provide an exposure projection apparatus, which allows the accurate superimposition of patterns projected by the optical projection system onto patterns already formed on the substrate.

A fourth aspect of the present invention is to provide an exposure projection apparatus, which is capable of adjusting Seidel's five aberrations that can occur in the optical projection system.

A fifth aspect of the present invention is to provide an exposure projection apparatus, which is capable of adjusting the Seidel aberrations without removing or disassembling the optical projection system.

A sixth aspect of the present invention is to provide an optical projection apparatus, which is capable of performing aberration adjustments quickly and easily.

The exposure projection apparatus, which is used in order to achieve the first through fifth aspects of the present invention comprises an illumination system, which illuminates a mask with a light beam and an optical projection system which projects the image of a pattern formed on the mask onto a substrate. Furthermore, the optical projection system includes a first barrel, which holds a plurality of optical elements, at least three second barrels, each holding at least one optical element disposed between the mask and the first barrel so that coma CO, astigmatism MS, and distortion Y of the optical projection system can be adjusted, and a first optical element, which is disposed between the substrate and the first barrel, so that either the spherical aberration or curvature of field of the optical projection system, or both, can be adjusted.

In the exposure projection apparatus of the present invention, at least three second barrels are installed separately from the first barrel of the optical projection system on the mask side of the first barrel, and a first optical element is installed on the substrate side of the first barrel. The second barrels are movable with respect to the first barrel and consequently various aberrations of the optical projection system, especially Seidel's five aberrations, can be adjusted quickly and easily without removing or disassembling the optical projection system. Accordingly, images of patterns can be projected onto the surface of the substrate under favorable imaging conditions at all times and pattern images can be accurately superimposed onto patterns formed on the substrate over the entire area of the substrate.

As a result, microdevices such as semiconductor elements, can be manufactured with a high degree of precision and the throughput and yield can be increased. Also, various aberrations of the optical projection system can easily be adjusted even after the exposure projection apparatus in which the optical projection system has been installed is transported into a clean room in which microdevices are manufactured, resulting in the time required for start-up and adjustment of the exposure projection apparatus to be greatly reduced.

The present invention is most effective in the case of optical projection systems consisting entirely of a plurality of refractive elements (lens elements, etc.), but is also effective in optical projection systems which combine refractive elements and reflecting elements (beam splitter, mirrors, etc.), i.e., so-called catadioptic optical systems. Furthermore, the optical projection system involved may be a reducing projection system, equal-magnification (1:1) projection system or enlarging projection system.

It is advantageous to make adjustments for spherical aberrations in the areas where the bundles of rays passing through the optical projection system from the mask are dense, i.e., in the vicinity of the pupil plane or image plane. Moreover, the curvature of field can be adjusted by altering the curvature radius of a single optical element in the optical projection system. Therefore, it is desirable that the first optical element be the optical element closest to the substrate. It is also desirable that this first optical element be an optical plate whose curvature radius or thickness (or both) are adjusted in accordance with the spherical aberration or curvature of field (or both aberrations) of the optical projection system. Additionally, it is desirable that the first optical element be fastened to the first barrel so that this first optical element can be freely attached and detached. As a result of this construction, it is possible to make quick and easy adjustments for the spherical aberration and curvature of field without increasing the size of the apparatus used to adjust the aberrations of the optical projection system, with the optical projection system remaining "as is" in the exposure projection apparatus.

The distortion Y, astigmatism MS, and coma CO (three of Seidel's five aberrations, the other two being spherical and curvature of field) can be effectively adjusted by moving at least one of the optical elements of the optical projection system, i.e., by altering the optical distances between at least two of the optical elements of the optical projection system. In particular, these three aberrations can be more easily adjusted using optical elements positioned closer to the mask installed in the object plane of the optical projection system. Accordingly, it is desirable that one of the three or more second barrels hold a second optical element consisting of the optical element located closest to the mask.

It is desirable that the three or more optical elements, held in the three or more second barrels, be aligned in order along the optical axis of the optical projection system from the mask side. Ideally, the distortion Y is adjusted by moving the optical element located closest to the object plane of the optical projection system, i.e., the optical element located closest to the mask, while the astigmatism MS is adjusted by moving the optical element which is second closest to the mask, and the coma CO is adjusted by moving the optical element which is third closest to the mask. In some cases, however, it may be difficult to adjust one of Seidel's five aberrations merely by moving one of the optical elements. Thus, it is desirable to adjust the positions of at least three optical elements on the optical axis so that the distortion Y, astigmatism MS and coma CO are respectively minimized.

As a result of the above construction, Seidel's five aberrations can be adjusted without any great alteration of the structure of the optical projection system furthermore, the adjustment mechanism can be attached without increasing the size of the optical projection system.

Additionally, it is also be possible to include spacers, which are respectively disposed between adjacent barrels, among the above-mentioned first barrel and three or more second barrels of the optical projection system, thus arranging the system so that various aberrations of the optical projection system can be adjusted by replacing the spacers in order to move the three or more optical elements disposed between the mask and the first barrel. In this configuration, it is desirable that adjacent barrels, among the three or more second barrels be connected to each other by means of screw members and that the spacers be washers with cut-outs which are mounted from the side with respect to the screw members. As a result of this construction, the optical distance (light path length) between at least two optical elements can be adjusted in a short time with the optical projection system remaining in the exposure projection apparatus and without any need for disassembly of the optical projection system.

It is also desirable that the optical projection system include driving mechanisms which move the three or more second barrels along the optical axis of the optical projection system relative to the first barrel. These driving mechanisms can be constructed from cylinder mechanisms and long members which are fastened to each of the respective three or more second barrels. One end of each long member is supported (so that pivoting is possible) on a fastening point of one of the two adjacent barrels, and an intermediate portion of this long member is supported on a fastening point of the other barrel and the other end of this long member is supported on the piston of a cylinder mechanism which is fastened to the first of the two barrels. The long members are caused to pivot by driving the cylinder mechanisms and as a result, the respective spacings of the first barrel and the three or more second barrels, i.e., the optical distances (light path lengths) of at least four optical elements, can be respectively adjusted using the principle of a lever.

The driving mechanisms can be constructed from piezoelectric elements and corresponding driving mechanisms respectively installed between adjacent pairs of the three or more second barrels, or from ball screws and corresponding driving mechanisms respectively attached to the three or more second barrels. As a result of the provision of these driving mechanisms, the distortion Y, astigmatism MS, and coma CO of the optical projection system can easily be adjusted by altering the respective spacings of the above-mentioned first barrel and the three or more second barrels. Especially in cases where piezoelectric elements are employed the mechanisms used to alter the respective spacings of a plurality of barrels can be reduced in size and simplified so that the adjustment of the three aberrations described above is further facilitated.

It is desirable that the optical projection system be also equipped with plate springs which are respectively disposed between adjacent barrels among the above-mentioned first barrel and the three or more second barrels, so that the above-mentioned three or more second barrels can be moved along the optical axis without causing any shifting of the second barrels in the direction perpendicular to the optical axis. In particular, it is desirable that the plate springs be annular and centered on the optical axis of the optical projection system, and that one surface of each of the plate springs be supported by one of the two barrels between which the plate spring is clamped, while the other surface of the plate spring is supported on the other barrel in a position which differs from the supporting positions on the first of the two barrels in the circumferential direction. By mounting such plate springs between respective pairs of the plurality of barrels, it is possible to allow movement and tilting of the optical elements on the optical axis of the optical projection system while preventing eccentricity (lateral deviation) of the optical elements.

The optical projection apparatus used in an exposure apparatus, in which patterns formed on a mask are transferred onto a substrate, is used in order to achieve the sixth object of the present invention is equipped with a) a first barrel which holds a plurality of optical elements; b) at least three second barrels, each holding at least one optical element disposed between the mask and the first barrel, which are moved relative to the first barrel so that the coma CO, astigmatism MS, and distortion Y are adjusted; and c) an optical device which is disposed on the substrate side of the first barrel, so that either the spherical aberration or the curvature of field, or both, are adjusted. Accordingly, aberration adjustments can be performed quickly and easily without disassembling the optical projection apparatus, and Seidel's five aberrations can easily be adjusted even after the optical projection apparatus has been installed in the exposure projection apparatus.

DESCRIPTION OF THE PREFERRED EMBODIMENTS

Figure 1:
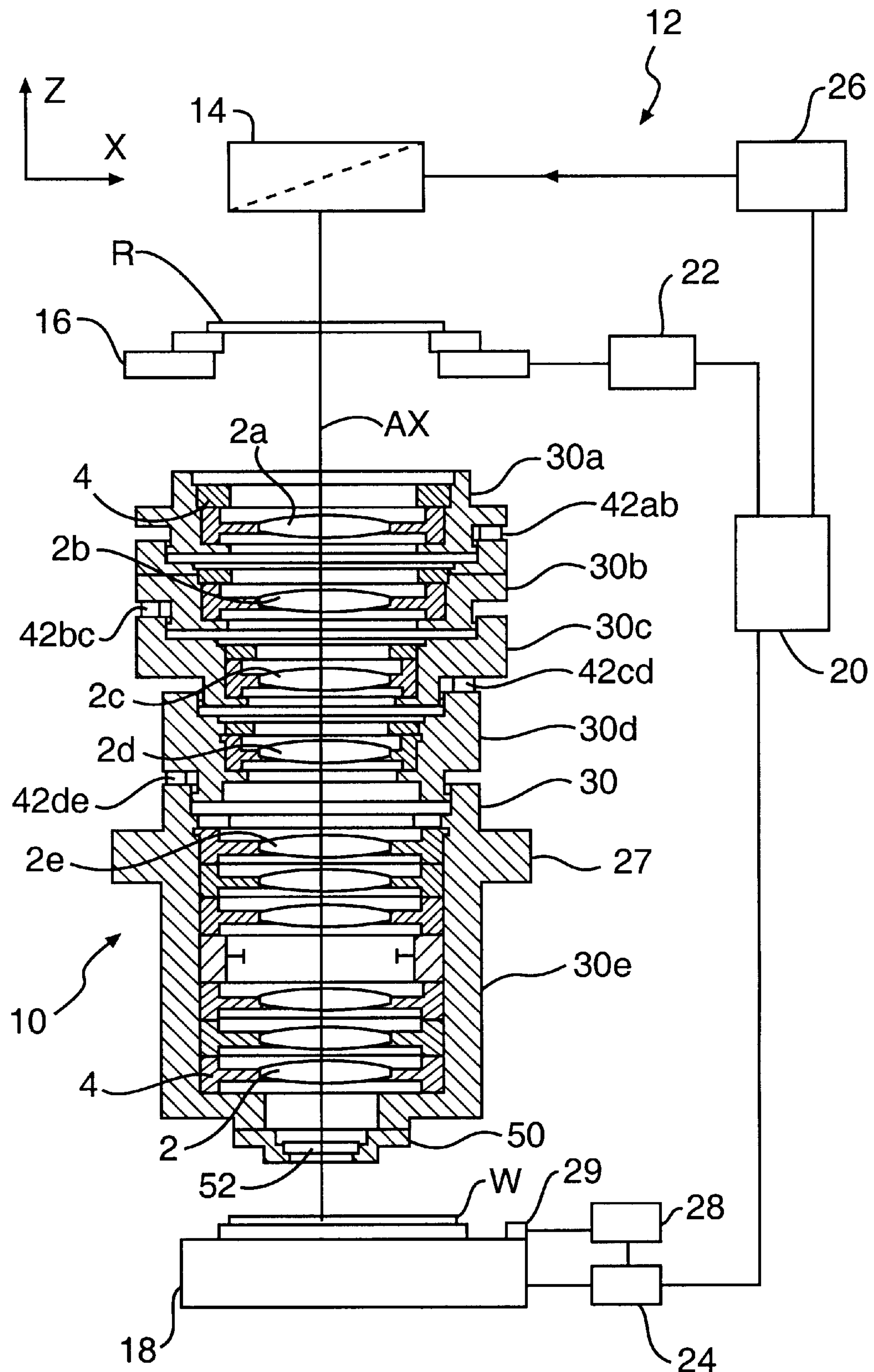
FIG. 1 is a schematic diagram which illustrates the construction of a exposure projection apparatus with a cross-sectional view of an optical projection system constructed according to the present invention.

A preferred embodiment of the present invention will now be described with reference to the attached figures. FIG. 1 is a schematic diagram which illustrates the construction of an exposure projection apparatus 12 equipped with an optical projection system 10 (shown in cross-section) constructed according to the present invention.

The exposure projection apparatus 12 shown in FIG. 1 is a so-called "stepper", i.e., a step-and-repeat type exposure projection apparatus in which the image of a circuit pattern drawn on a reticle R is projected onto a wafer W by the optical projection system 10, and a plurality of shot areas on the wafer W are successively exposed using the pattern image.

The exposure projection apparatus 12 is includes an exposure light source 26, which emits a light beam in the ultraviolet wavelength region (e.g., the harmonic wave of a KrF excimer laser, ArF excimer laser or YAG laser) and an optical illumination system 14. The optical illustration system 14 includes an optical integrator (fly-eye lens), relay lens, condenser lens, integrator sensor, and a speckle-reducing apparatus, etc., as disclosed in U.S. Pat. No. 5,307,207 which is hereby incorporated by reference. The exposure projection apparatus 12 also includes a reticle stage 16, which carries the reticle R and which is movable, a optical projection system 10, which has a plurality of lens elements arranged along the optical axis AX, a wafer stage 18, which carries the wafer W and which moves in the direction along the optical axis AX of the optical projection system 10 (i.e., in the Z direction) and in the directions perpendicular to the optical axis AX (i.e., in the X and Y directions), and a control system 20, which controls the overall apparatus. For convenience of description, the cross-sectional structure of the optical projection system 10 is shown in FIG. 1.

The laser beam emitted by the exposure source 26, which is of a pulsed laser variety, enters the optical illumination system 14 and the optical illumination system 14 illuminates the reticle R with the laser beam. The reticle stage 16, which is positioned beneath the illumination optical system 14, holds the reticle R via a reticle holder, not shown in the figures. In order to position the reticle R in a prescribed position, the reticle stage 16 is capable of moving in two dimensions within the plane perpendicular to the optical axis AX of the optical projection system 10 in accordance with signals from the control apparatus 20, which includes a laser interferometer 28. Specifically, the reticle R is positioned so that the center point of the reticle pattern coincides with the optical axis AX of the optical projection system 10. The pattern on the reticle R, illuminated by the illumination optical system 14, is projected onto the wafer W via the optical projection system 10.

The optical projection system 10 is disposed between the reticle R and the wafer W. In this particular optical projection system 10, as will be more precisely described later, a plurality of lens elements 2 are coaxially arranged inside a barrel 30 so that these lens elements 2 have a common optical axis AX. The reticle R is positioned in the object plane of the optical projection system 10, and the wafer W is positioned in the image plane of the optical projection system 10, so that the pattern plane of the reticle R and the surface of the wafer W are in a conjugate relationship, with respect to the optical projection system 10. The magnification of the optical projection system 10 is determined by the magnifications of the plurality of lens elements 2. The optical projection system 10 is supported by a stand (not shown in the figures) inside the exposure projection apparatus 12. FIG. 1 shows annular projecting parts 27 which are formed on the circumferential portion of the barrel 30 in order to suspend the optical projection system 10 from the stand.

The wafer W is carried on a wafer stage 18, and is capable of moving in two dimensions in the plane perpendicular to the optical axis AX of the optical projection system 10 (i.e., in an orthogonal coordinate system XY regulated by a laser interferometer 28). Although this is not shown in the figures, the wafer stage 18 is constructed mainly from an XY stage which can move in the X and Y directions and a table which is mounted on the XY stage, which can tilt and perform micro-movements in the Z direction. The wafer W is carried on the table and is fastened in place by vacuum suction. A mirror 29, which reflects the laser beam from the laser interferometer 28, is installed on the wafer stage 18 (i.e., on the table described above) and the respective positions (coordinates) of the wafer W in the X and Y directions are detected by the laser interferometer 28.

A stage control system 24 controls the XY stage and table by sending signals to the driving mechanism of the wafer stage 18 in accordance with commands from the control system 20 and detection signals from the laser interferometer 28. As a result, an alignment operation, which aligns the pattern image of the reticle R with one of the shot areas on the wafer W with respect to the X and Y directions, and a focusing and leveling operation, which causes the image plane of the optical projection system 10 to coincide with the surface of the above-mentioned shot area, are performed.

The surface of the wafer W is coated beforehand with a photoresist, and a pattern of indentations and projections corresponding to the reticle pattern is formed on the wafer W by exposing and developing the photoresist and then etching the wafer W using the resist pattern as a mask.

The control system 20 controls the power and pulse oscillation timing of the laser beam emitted by the exposure light source 26, and the movements of the reticle stage 16 and wafer stage 18 and furthermore, the control system also controls the overall operation of the exposure projection apparatus 12.

In the exposure projection apparatus 12 constructed as described above, when the reticle R is illuminated by the illumination optical system 14, an image of the pattern of the reticle R is reduced and projected onto the wafer W by the optical projection system 10. As a result, this pattern is transferred onto one shot area on the surface of the wafer W. When the exposure of this one shot area has been completed, the wafer stage 18 is driven so that the next shot area is accurately aligned with the pattern image in the X, Y, and Z directions. As a result, the pattern image is transferred to the next shot area.

The structure of the optical projection system 10 will now be described with reference to FIG. 1. A plurality of lens elements 2 are held by the respective annular lens cells 4, wherein a plurality of lens cells 4 are lined up along the optical axis AX inside the barrel 30. Accordingly, the respective optical axes of the lens elements 2 held by the lens cells 4 coincide with the optical axis AX of the optical projection system 10. The barrel 30 is a split-type barrel, i.e., the barrel is constructed from a plurality of barrels. In the preferred embodiment, the barrel 30 is split into four barrels **30*a*, 30*b*, 30*c*, and 30*d*, which respectively hold the four lens elements 2*a*, 2*b*, 2*c*, and 2*d* located closest to the reticle R (among the plurality of lens elements 2 constituting the optical projection system 10), and an additional barrel 30*e* which holds lens elements 2, other than the four lens elements 2*a* through 2*d*, i.e., a plurality of lens elements 2 are positioned between the barrel 30*d*** and the wafer W.

Figure 2A:
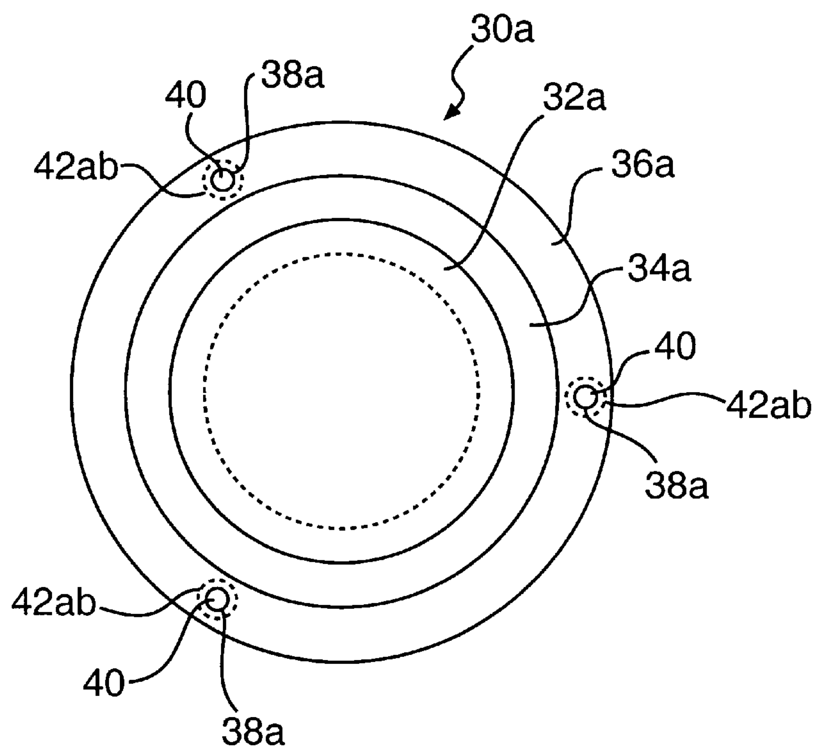
FIG. 2A is an overhead view, as seen from the reticle R, illustrating the construction of the split-type barrel constituting the optical projection system shown in FIG. 1.
Figure 2B:
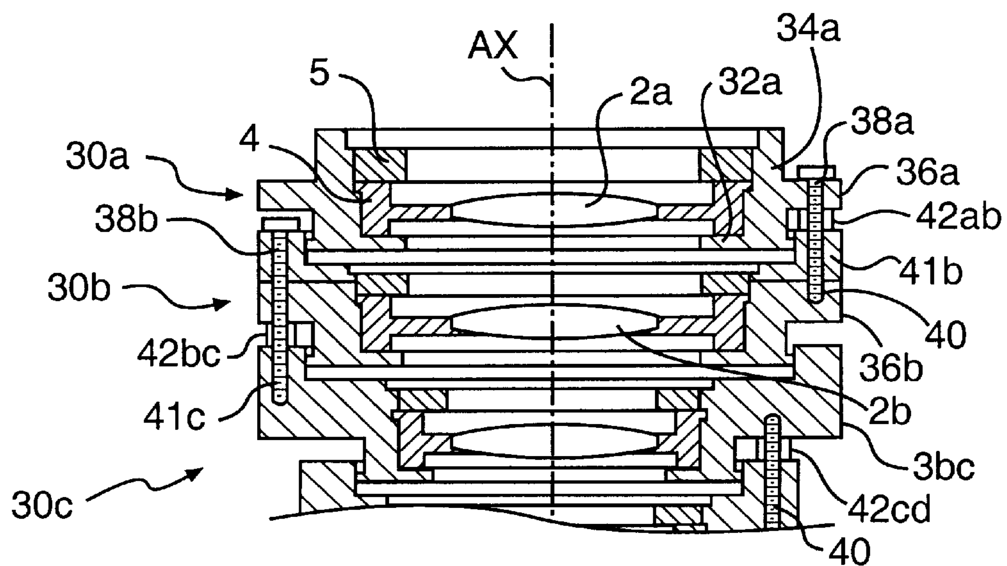
FIG. 2B is a sectional view of the split-type barrel.

FIGS. 2A and 2B show an expanded view of portions of the optical projection system 10 shown in FIG. 1. FIG. 2A shows the barrel **30*a* as seen from above (i.e., from the reticle side), and FIG. 2B shows a sectional view of the barrels 30*a* through 30*c***.

As is shown in FIGS. 2A and 2B, the barrel **30*a* is cylindrical and has a supporting part (annular projecting part) 32*a* which protrudes inwardly and an opening diameter that is smaller than the external diameter of the corresponding lens frame 4 is installed at the bottom end of the barrel 30*a*. The lens frame 4 is supported inside the barrel 30*a* by the supporting part 32*a* and side wall 34*a* of the barrel 30*a*. Furthermnore, a screw part is formed in the inside of the upper portion of the side wall 34*a*, and a retainer 5, which has a screw part formed in its outer circumference, is screwed into the screw part, so that the lens frame 4 is pressed downwardly. As a result, the lens frame 4 is fastened in place inside the barrel 30*a*. Such a structure, in which the lens frame 4 is fastened inside the barrel by means of a retainer 5, is also employed in each of the barrels 30*b* through 30*e***.

The barrel **30*a* has an outside protruding part 36*a*, which protrudes outwardly from the side wall 34*a*. As is shown in FIG. 2A, this outside protruding part 36*a* is formed so that it completely surrounds the barrel 30*a*, and three bolt holes 38*a* are formed at 120° intervals along the outside protruding part 36*a*. The barrel 30*a* and 30*b* are coupled by screwing bolts 40 (via the bolt holes 38*a*) into screw holes formed in a similar manner as the outside protruding part 36*b* formed on the barrel 30*b***.

The bolts 40 are screwed into the screw holes via horseshoe-shaped washers **42*ab*, of a prescribed thickness. The washers 42*ab* are disposed between the outside protruding part 36*a* of the barrel 30*a* and the outside protruding part 36*b* of the barrel 30*b*. Accordingly, the spacing between the barrel 30*a* and 30*b*, or the optical distance (light path length) between the lens element 2*a* and 2*b*, respectively inside the barrels 30*a* and 30*b* can be adjusted by changing the thickness of the washers 42*ab*. Since the washers 42*ab* are horseshoe-shaped they can easily be removed from the bolts 40 merely by loosening the bolts 40. Accordingly, washers 42*ab*, of a certain thickness, can be selected from a plurality of washers 42*ab* with different thicknesses and the selected washers 42*ab* can then be mounted on the bolts 40 between the barrel 30*a* and 30*b* in accordance with the particular aberration of the optical projection system 10, especially in accordance with at least one of the three aberrations, i.e., distortion, astigmatism and coma. As a result of the use of these washers 42*ab*, the optical distance (light path length) between the lens element 2*a* and lens element 2*b* can easily be adjusted from the outside of the barrel 30 without separating the barrels 30*a* and 30*b***.

The three washers 42*ab* mounted between the outside protruding part 36*a* and outside protruding part 36*b* can all have the same thickness or may be respectively different in thicknesses. By using three washers 42*ab* with different thicknesses, it is possible to tilt the lens element 2*a* with respect to the lens element 2*b*, so that trapezoidal distortion can also be adjusted.

In FIG. 2B, the barrel 30*b* has basically the same structure as the barrel 30*a*, however, the outside protruding part 36*b* of the barrel 30*b* extends upwardly toward the outside protruding part 36*a* of the barrel 30*a* and the inside of the outside protruding part 36*b* engages with the bottom portion of the barrel 30*a*. The use of such an engaging structure makes it possible to prevent eccentricity between the two barrels. The barrels 30*c* and 30*d* also have a similar structure for preventing eccentricity.

The remaining structures are similar to that of the barrel 30*a*. Specifically, the barrel 30*b* and barrel 30*c*, the barrel 30*c* and barrel 30*d*, and the barrel 30*d*, and barrel 30*e*, are respectively coupled by three bolts 40 via three washers 42*bc*, 42*cd*, and 42*de* in each case, spaced at intervals of 120°. The respective spacings of the lens elements 2 held in these barrels 30*b* through 30*e* can easily be adjusted by altering the thicknesses of the washers 42*bc*, 42*cd*, and 42*de*, respectively.

Furthermnore, in order to avoid mechanical interference of the bolts 40, the positions at which the barrel 30*a* and barrel 30*b* are connected by the three bolts 40 and the positions at which the barrel 30*b* and barrel 30*c* are connected by the three bolts 40 are shifted by 60° relative to each other in the circumferential direction. For example, if the angular positions of the three bolts 40 which couple the barrel 30*a* and barrel 30*b* are set at 0°, 120°, and 240° then the angular positions of the three bolts 40, which couple the barrel 30*b* and barrel 30*c* are set at 60°, 180°, and 300°, and the angular positions of the three bolts 40 which couple the barrel 30*c* and barrel 30*d* are set at 0°, 120°, and 240°.

Returning to FIG. 1, a glass frame 50 is screwed onto the lower end portion (barrel 30*e*) of the optical projection system 10, and a glass plate 52, which has a curved surface, is mounted inside this glass frame 50. The light path length from the optical projection system 10 (i.e., the lens element 2 closes to the wafer W) to the wafer W, that is, the spherical aberration of the optical projection system 10, can be adjusted by altering the thickness of the glass plate 52. The curvature of field of the optical projection system 10 can also be adjusted by altering the curvature radius of the glass plate 52. Accordingly, it is convenient to prepare in advance a plurality of glass frames 50 mounting a plurality of glass plates 52 with different thicknesses and/or curvature radii, and to change the glass plate 52 along with the glass frame 50 when adjusting the spherical aberration or curvature of field as described below. When the aberration of the optical projection system 10 is adjusted by means of the glass plate 52, it is necessary merely to replace the glass frame 50 and accordingly, there is no need to disassemble the optical projection system 10.

The method by which Seidel's five aberrations are adjusted using the split-type barrel 30 shown in FIG. 1 and FIGS. 2A and 2B will now be described. Seidel's five aberrations are: 1) distortion, 2) curvature of field, 3) astigmatism, 4) coma and 5) spherical aberration of the optical projection system 10. The distortion, astigmatism and coma aberrations, are adjusted by respectively altering the spacing between the barrels 30*a* and 30*b*, the spacing between the barrels 30*b* and 30*c*, and the spacing between the barrels 30*c* and 30*d*, i.e., the light path length between the lens elements 2*a* and 2*b*, the light path length between the lens elements 2*b* and 2*c*, and the light path length between the lens elements 2*c* and 2*d*. Meanwhile, the remaining two aberrations, the spherical aberration and the curvature of field, are adjusted by altering the thickness of the glass plate 52 and the curvature radius of the glass plate 52, respectively.

If we assume that $d_1$ is the amount of variation in the spacing $L_{ab}$ between the lens elements 2*a* and 2*b* is(i.e., the amount of movement of the lens element 2*a* in the direction of the optical axis), that $d_2$ is the amount of variation in the spacing $L_{bc}$ between the lens elements 2*b* and 2*c* (i.e., the amount of movement of the lens element 2*b* in the direction of the optical axis), and that $d_3$ is the amount of variation in the spacing $L_{cd}$ between the lens elements 2*c* and 2*d* (i.e., the amount of movement of the lens element 2*c* in the direction of the optical axis), the relationship between the amounts of variation in the respective spacings of these four lens elements and the amount of distortion (Y), amount of astigmatism (MS) and amount of coma (CO) of the optical projection system 10 can be expressed by the following matrix equation:

$$\begin{bmatrix} Y \\ MS \\ CO \end{bmatrix} = \begin{bmatrix} Y_1 & Y_2 & Y_3 \\ MS_1 & MS_2 & MS_3 \\ CO_1 & CO_2 & CO_3 \end{bmatrix} \begin{bmatrix} d_1 \\ d_2 \\ d_3 \end{bmatrix}$$

In the above equation, $Y_1$, $Y_2$, and $Y_3$ indicate the distortion adjustment coefficient per unit amount of movement of the lens element 2*a*, 2*b*, and 2*c*, respectively. Furthermore, $MS_1$, MS2, and $MS_3$ indicate the astigmatism adjustment coefficient per unit amount of movement of the lens element 2*a*, 2*b*, and 2*c*, respectively. Moreover, $CO_1$, $CO_2$, and $CO_3$ indicate the coma adjustment coefficient per unit amount of movement of the lens element 2*a*, 2*b*, and 2*c*, respectively.

It is assumed that the distortion Y, astigmatism MS, and coma CO, respectively vary according to the respective spacings $L_{ab}$, $L_{bc}$, and $L_{cd}$ of the four lens elements 2*a* through 2*d*, and that the proportion of this variation differs in each lens element 2*a*, 2*b*, and 2*c*. The elements $Y_1$, $Y_2$, $Y_3$, $MS_1$, $MS_2$, $MS_3$, $CO_1$, $CO_2$, and $CO_3$ in the above matrix equation can be determined by calculation in the optical design stage of the plurality of lens elements 2 making up the optical projection system 10.

Furthermore, the actual distortion Y, astigmatism MS, and coma CO of the optical projection system 10 can be determined by detecting the position and shape of a pattern image obtained by so-called "trial burning" in which a prescribed test pattern is transferred onto the wafer using the exposure projection apparatus 12. By substituting the values of the distortion Y, astigmatism MS, and coma CO, which are to be corrected, determined from these detection results, and the matrix elements $Y_1$, $Y_2$, $Y_3$, $MS_1$, $MS_2$, $MS_3$, $CO_1$, $CO_2$, and $CO_3$ calculated by the matrix equation, it is possible to determine the amounts of variation $d_1$, $d_2$, and $d_3$ in the respective spacings of the four lens elements 2*a* through 2*b* (i.e., the amounts of movement of the three lens elements 2*a* through 2*c* in the direction of the optical axis).

The method used to adjust the spherical aberration and curvature of field of the optical projection system 10 shown in FIG. 1 and FIGS. 2A and 2B will now be described. As mentioned above, a plurality of glass frames 50 which can be mounted on the lower end (barrel 30*e*) of the optical projection system 10 are prepared. Glass plates (or lens elements) with different thicknesses and/or curvature radii are respectively mounted in the glass frames 50. Then, for example, a prescribed test pattern is transferred onto the wafer W using the optical projection system 10 in which a glass frame 50 carrying a glass plate with a prescribed thickness and curvature radius is mounted, and the pattern (latent image or resist image) obtained by means of this trial burn is detected, thus determining the spherical aberration and curvature of field. As a result, a glass frame 50 mounting a glass plate 52 which has a thickness and curvature radius corresponding to the amounts of spherical aberration and curvature of field that are to be adjusted is selected, and the glass frame 50 mounted on the optical projection system 10 is replaced with this selected glass frame 50. As previously mentioned, the spherical aberration is adjusted by altering the thickness of the glass plate 52, while the curvature of field is adjusted by altering the curvature radius of the glass plate 52.

In the present embodiment, the distortion Y, astigmatism MS, and coma CO of the optical projection system 10 are adjusted by altering the amounts of movement of the three barrels 30*a* through 30*c* along the optical projection system 10 as shown in FIG. 1 and FIGS. 2A and 2B. However, it is also possible to arrange the system so that the spacing $L_{de}$ between the lens element 2*d* and lens element 2*e* (i.e., the position of the lens element 2*d* in the direction of the optical axis) can be altered, and to adjust the three aberrations mentioned above, i.e., the distortion Y, astigmatism MS, and coma CO, with the amounts of variation $d_1$, $d_2$, $d_3$, and $d_4$ in the spacings of the five lens elements 2*a* through 2*e* (i.e., the amounts of movement of the four lens elements 2*a* through 2*d*) as parameters.

In this case, for example, the distortion is divided into two distortions detected at two different image height positions, and these distortion Y, along with the astigmatism MS, and coma CO, are adjusted by determining the amounts of variation $d_1$ through $d_4$ in the spacings of the five lens elements 2*a* through 2*e* (i.e., the amounts of movement of the four lens elements 2*a* through 2*d* in the direction of the optical axis) on the basis of the four amounts of aberration obtained by a trial burn, similar to that described above, and 16 matrix elements are determined by calculation from a matrix equation consisting of four rows and four columns.

Furthermore, it is also possible to design the system so that six or more lens elements are respectively held in six or more barrels so that five or more lens spacings are altered by respectively moving these six or more barrels, thus respectively adjusting the three aberrations of the optical projection system 10, i.e., the distortion, astigmatism, and coma, or the four aberrations, i.e., two distortions, astigmatism, and coma.

In the present example, the distortion, astigmatism, and coma of the optical projection system 10 are adjusted by altering the amounts of movement of the three lens elements 2*a* through 2*c* of the optical projection system 10, i.e., the spacings $L_{ab}$, $L_{bc}$, and $L_{cd}$ of the four lens elements 2*a* through 2*d*. Here, as the three lens elements 2*a* through 2*c* move, the spacing $L_{ra}$ between the reticle R and the lens element 2*a* closest to the reticle R may also vary. The alteration of this spacing $L_{ra}$ also causes the respective aberrations of the optical projection system 10 to vary.

Accordingly, in cases where the effect (variation in aberration) caused by the alteration of this spacing $L_{ra}$ cannot be ignored, the distortion, astigmatism, and coma, can be adjusted by determining the amounts of variation $d_r$, $d_1$, $d_2$, and $d_3$ in the respective spacings $L_{ra}$, $L_{ab}$, $L_{bc}$, and $L_{cd}$ of the reticle R and the four lens elements 2*a* through 2*d* caused by the movements of the three lens elements 2*a* through 2*c*, in the same manner as described above. The same is true in cases where four or more lens elements are moved.

In the present example, each of the four barrels 30*a* through 30*d* holds only a single lens element, however, depending on the optical characteristics of the optical projection system 10, it is also possible for each of the four barrels to hold two or more lens elements.

In the present example, the aberrations of the optical projection system 10 are determined by trial burning but it is also possible to illuminate marks on the reticle R by means of the illumination optical system 14 to receive images of these marks (projected by the optical projection system 10) by means of a photoelectric detector via a slit-plate disposed on the wafer stage 18. The distortion and astigmatism, of the optical projection system 10 is measured in this way. Since such a construction is disclosed in U.S. Pat. No. 4,629,313, which is hereby incorporated by reference, a detailed description is omitted here.

Figure 3:
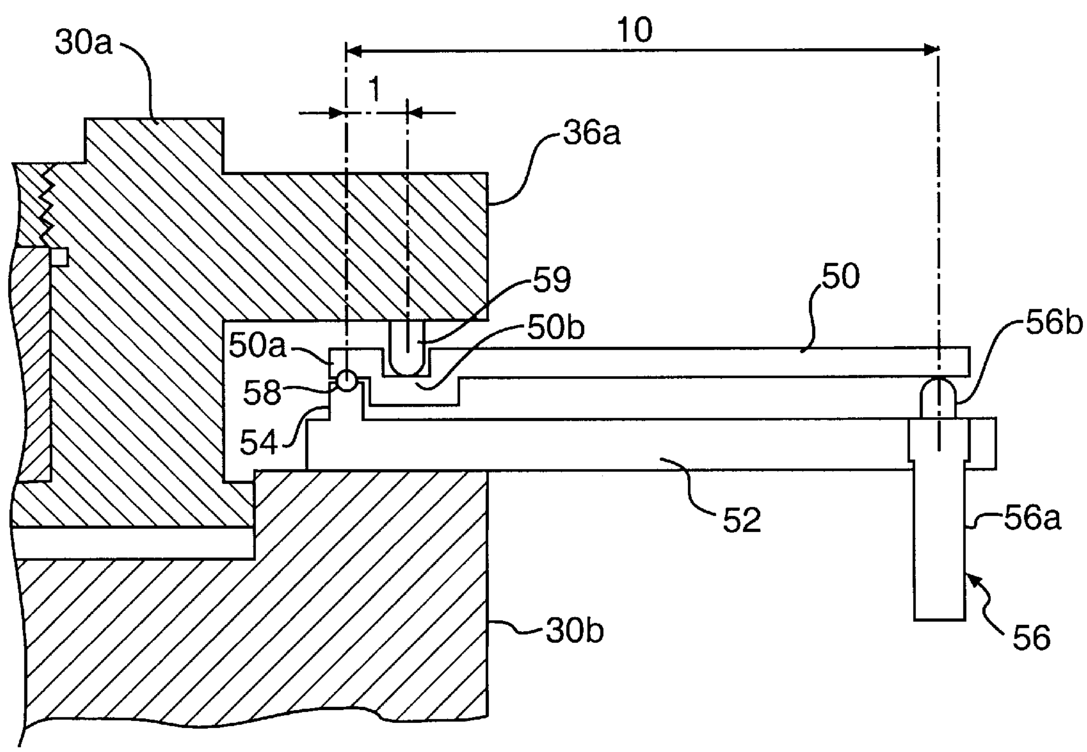
FIG. 3 is a schematic diagram illustrating an example of the mechanism which moves the split-type barrel in order to adjust the spacing of two lens elements.

Additionally, in the present example, a mechanism is described in which the optical distance (light path length) between two lens elements is adjusted using a plurality of washers 42 with different thicknesses. However, an example in which the light path length between two lens elements 2 is precisely adjusted using a micrometer may be indicated as another mechanism for adjusting the light path length. FIG. 3 shows an enlargement of the outside protruding parts 36*a* and 36*b* of the barrels 30*a* and 30*b* in FIG. 2B (right-hand portions of the barrels shown in FIG. 2B). In FIG. 3, movable long members 51 and fixed long members 53 are disposed between the outside protruding parts 36*a* and 36*b* (as a mechanism for fine adjustment of the spacing of these parts) instead of washers 42 and bolts 40.

The undersurface of the fixed long members 53 are fastened to the upper surface of the outside protruding part 36*b* of the barrel 30*b*. A bearing supporting part 54 which supports a bearing 58 is formed at one end of each fixed long member 53. The cylinder part 56*a* of a micrometer 56, consisting of a piston 56*b* and a cylinder part 56*a*, is embedded in the other end of each fixed long member 53. The piston 56*b* of the micrometer 56 can be extended toward the movable long member 51 by turning a dial (not shown in the figures) which is mounted on the cylinder part 56*a*.

As is shown in FIG. 3, a bearing supporting part 50*a* is formed in one end of each movable long member 51, and the bearing 58 is supported by the bearing supporting parts 54 and 50*a* of the fixed long member 53 and movable long members 51. Furthermore, a C-shaped bearing 50*b* is formed in the vicinity of the bearing supporting part 50*a*. This bearing 50*b* supports the barrel 30*a* with a fixed projecting part 59 formed on the undersurface of the outside protruding part 36*a* of the barrel 30*a* being used as a supporting point. The other end of each of the movable long member 50 is driven upward by the tip of the piston 56*b* of the micrometer 56 embedded in the corresponding fixed long member 53. When the dial of one of the micrometers 56 is turned so that the corresponding piston part 56*b* is caused to extend further from the cylinder part 56*a*, the corresponding movable long member 51 pivots upward with the bearing 58 as a supporting point. Since the bearing 50*b* of the corresponding movable long member 51 supports the above-mentioned fixed projecting part 59 on the outside protruding part 36*a*, the barrel 30*a* is caused to move upward. As is shown in FIG. 3, the ratio of a) the distance from the fixed projecting part 59 contacting the bearing **50*b* to the bearing 58, to b) the distance from the fixed projecting part 59 to the point of contact between the movable long member 51 and the piston part 56*b* is 1:10. Accordingly, the amount of the above-mentioned movement is 1/10th the amount of projection of the piston 56*b*. This movable long member 51 functions as a lever and as a result of this reduction mechanism, the load applied to the micrometer 56 is 1/10th the load applied to the bearing 50*b*. For example, in cases where a micrometer 56** with a resolution of 1 micron and a withstand load of 2 kgf is utilized, a micro-motion mechanism with a resolution of 0.1 microns and a withstand load of 20 kgf is obtained.

The above-mentioned movable long members 51, fixed long members 53, micrometers 56, bearings 58 and fixed projecting parts 59 are formed at three positions located at intervals of 120° in the circumferential direction of the outside protruding parts **36*a* and 36*b* of the barrels 30*a* and 30*b*, respectively. Accordingly, the light path length between the lens element 2*a* accommodated inside the barrel 30*a* and the lens element 2*b* accommodated inside the barrel 30*b* can be precisely adjusted by adjusting the micrometers 56 in these three areas. Similarly, the above-mentioned movable long members 51, fixed long members 53, micrometers 56, bearings 48 and fixed projecting parts 59 are installed not only between the barrels 30*a* and 30*b*, but also between the barrels 30*b* and 30*c*, the barrels 30*c* and 30*d*, and the barrels 30*d* and 30*e***, at three places located at intervals of 120° in the circumferential direction of the outside protruding parts.

The amount of variation $d_1$ in the spacing $L_{ab}$ between the lens elements **2*a* and 2*b*, the amount of variation $d_2$ in the spacing $L_{bc}$ between the lens elements 2*b* and 2*c* and the amount of variation $d_3$ in the spacing $L_{cd}$ between the lens elements 2*c* and 2*d* are determined by substituting the values of the distortion Y, astigmatism MS, and coma CO of the projection optical system 10 obtained by trial burning, and the matrix elements $Y_1$, $Y_2$, $Y_3$, $MS_1$, $MS_2$, $MS_3$, $CO_1$, $CO_2$, and $CO_3$ determined from the calculations, into the matrix equation. Furthermore, the distortion, astigmatism and coma of the optical system projection 10 can be adjusted by using the mechanism for the adjustment of the spacing of the lens elements 2 as shown in FIG. 3 to move the three lens elements 2*a*, 2*b*, and 2*c*** in the direction of the optical axis in accordance with the amounts of variation $d_1$ through $d_3$ thus determined.

Figure 4:
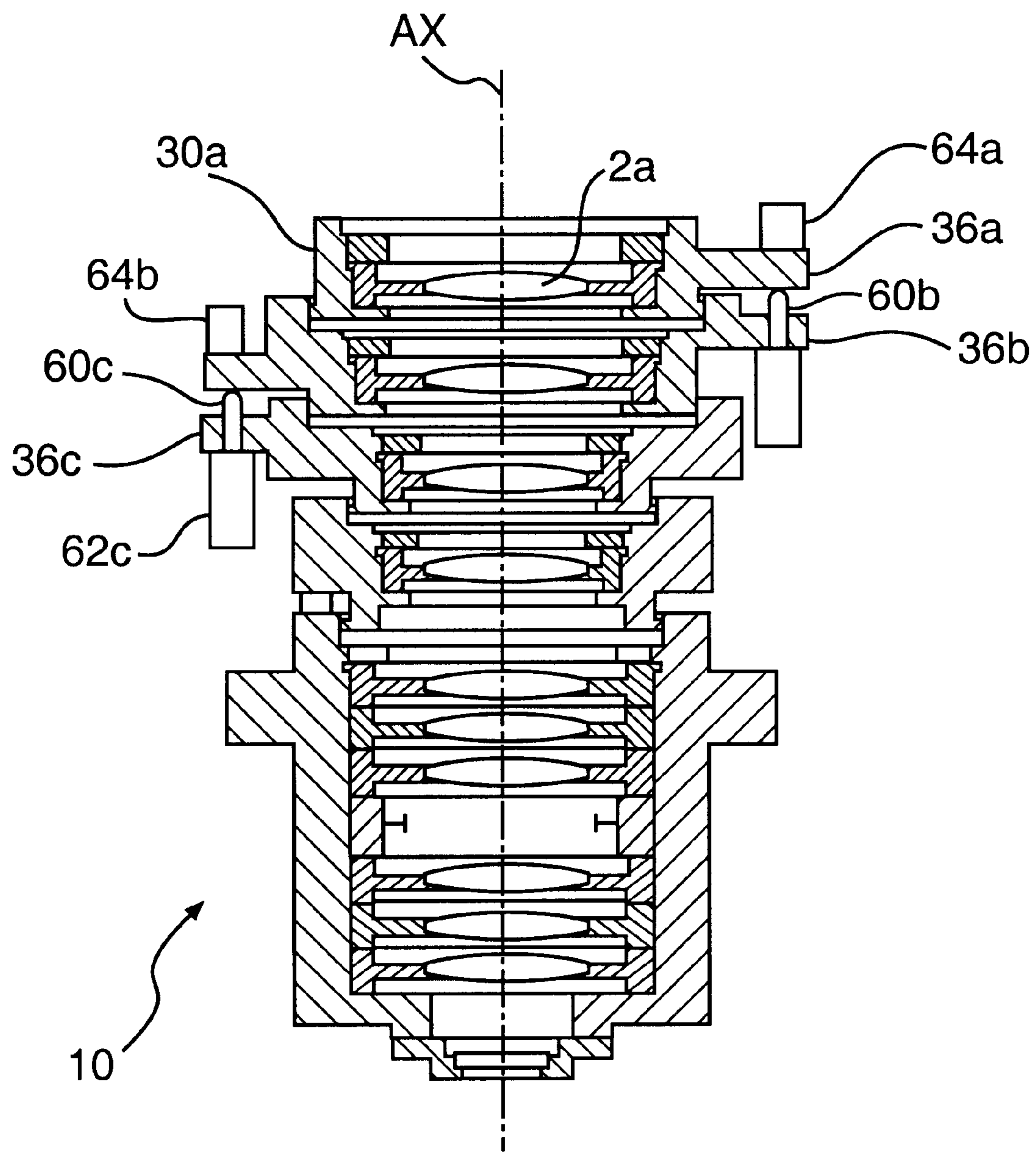
FIG. 4 is a schematic diagram which illustrates another embodiment of a mechanism which moves the split-type barrel in order to adjust the spring of two lens elements.

Another mechanism for adjusting the light path lengths of at least two lens elements will now be described with reference to FIG. 4. In order to allow convenient description of this mechanism, only the optical projection system 10 inside the exposure projection apparatus 12 is shown in FIG. 4. In the case of this optical projection system 10, actuators **60*b* and 60*c* are mounted instead of the washers 42 as shown in FIG. 1 and FIGS. 2A and 2B, in order to adjust the light path length between the lens elements 2*a* and 2*b* held in the barrels 30*a* and 30*b*, and the light path length between the lens elements 2*b* and 2*c* held in the barrels 30*b* and 30*c*. The barrels 30*a*, 30*b*, and 30*c* have respective outside protruding parts 36*a*, 36*b*, and 36*c* similar to those in the structure shown in FIG. 1 and FIG. 2B. Furthermore, in order to mount actuators 60*b* and 60*c* and displacement detectors 64*a* and 64*b* on these three outside protruding parts 36*a* through 36*c*, the outside protruding parts 36*a* and 36*b* are caused to protrude further outward (than the outside protruding parts as shown in FIG. 1 and FIG. 2B) at points located at 120° intervals. The main body parts of the actuators 60*b* are embedded in the outside protruding part 36*b* of the barrel 30*b*, and the spacing between the outside protruding part 36*a* of the barrel 30*a* and the outside protruding part 36*b* of the barrel 30*b* is adjusted by adjusting the amount of protrusion of the pistons protruding from the main body parts of the actuators 60*b*. Displacement detectors 64*a* are disposed on the upper surface of the outside protruding part 36*a* in positions opposite the actuators 60*b***, so that variations in the amount of protrusion of the pistons can be measured.

These actuators **60*b* and displacement detectors 64*a* are respectively installed at three areas located at 120° intervals on the outside protruding parts 36*a* and 36*b* of the barrels 30*a* and 30*b*. Accordingly, the light path length between the lens element 2*a* accommodated in the barrel 30*a* and the lens element 2*b* accommodated in the barrel 30*b* can be precisely adjusted by adjusting the actuators 60*b* in the three locations. Similarly, actuators 60*b* and displacement detectors 64*a* are installed not only between the barrel 30*a* and barrel 30*b*, but also on the outside protruding parts 36*b* and 36*c* of the barrels 30*b* and 30*c* at 120° intervals as shown in FIG. 4. Here, as is shown in FIG. 5 in which the optical projection system 10 shown in FIG. 4 is viewed from above, the actuators 60*b* installed in the outside protruding part 36*b* of the barrel 30*b* and the actuators 60*c* installed in the outside protruding part 36*c* of the barrel 30*c* are shifted by 60° relative to each other in the circumferential direction in order to prevent mechanical interference between the respective actuators 60*b* and 60*c***.

Figure 5:
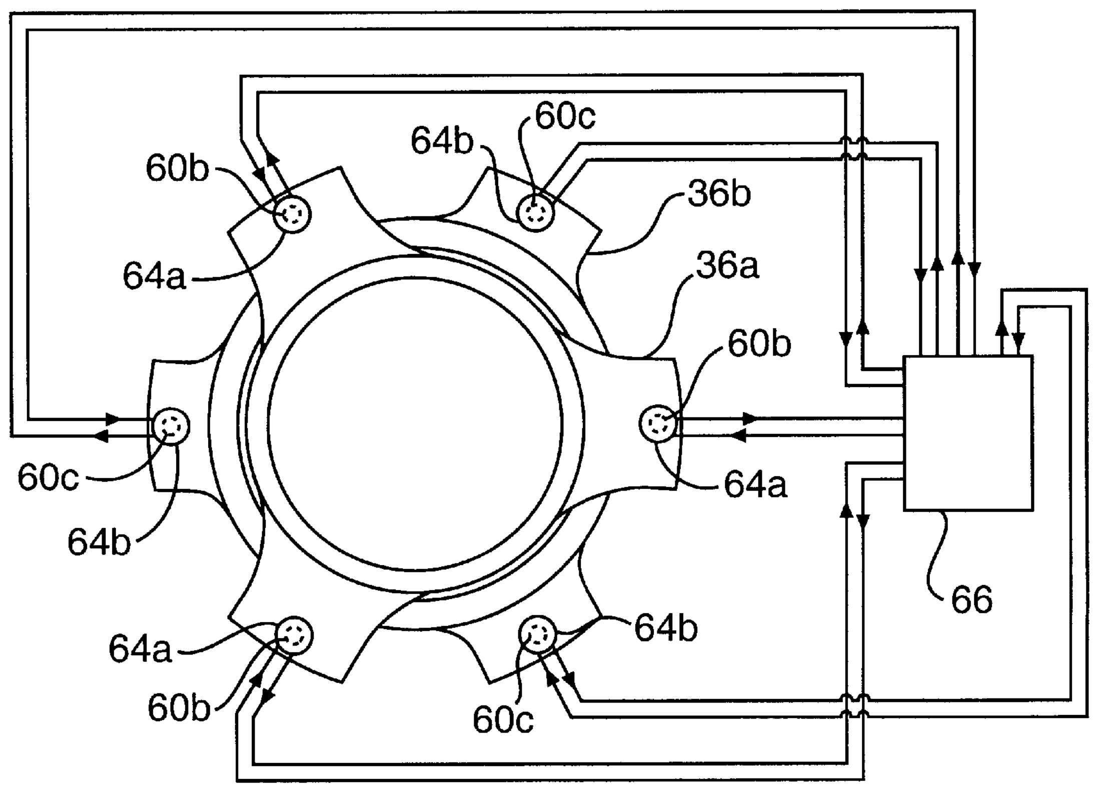
FIG. 5 is a schematic diagram which illustrates the construction of a movement mechanism for the split-type barrel which includes a displacement detector, actuator, and an actuator control device.

As is shown in FIG. 5, the optical projection system 10 is equipped with a control device 66 which is used to adjust the light path lengths between two lens elements by controlling the actuators **60*b* and 60*c*. The control device 66 inputs signals corresponding to the amounts of displacement of the actuators 60*b* and 60*c* detected by the displacement detectors 64*a* and 64*b*, and sends driving signals to the actuators 60*b* and 60*c* in order to adjust the spacing of two lens elements (2*a* and 2*b*, or 2*b* and 2*c***).

The amount of variation $d_1$ in the spacing $L_{ab}$ between the lens elements **2*a* and 2*b*, the amount of variation $d_2$ in the spacing $L_{bc}$ between the lens elements 2*b* and 2*c* and the amount of variation $d_3$ in the spacing $L_{cd}$ between the lens elements 2*c* and 2*d* are determined by substituting the values of the distortion Y, astigmatism MS and coma CO of the optical projection system 10 obtained by trial burning as described above, and the matrix elements $Y_1$, $Y_2$, $Y_3$, $MS_1$, $MS_2$, $MS_3$, $CO_1$, $CO_2$, and $CO_3$ determined from the calculations, into the above-mentioned matrix equation. Furthermore, the distortion, astigmatism and coma of the optical projection system 10 can be effectively adjusted by using the spacing adjustment mechanism shown in FIGS. 4 and 5 to move the lens elements 2*a* through 2*c*** in the direction of the optical axis in accordance with the amounts of variation $d_1$ through $d_3$ thus determined.

In the optical projection system 10 shown in FIGS. 4 and 5, combinations of encoder-equipped motors and ball screws can be used as the actuators **60*b* and 60*c* and displacement detectors 64*a* and 64*b*. Furthermore, additional displacement sensors may be installed in order to achieve an even further improvement in precision. Moreover, potentiometers, optical encoders, electrostatic capacitance sensors or laser interferometers, etc., may be appropriately selected for use as the displacement detectors 64*a* and 64*b*** in accordance with the precision required. If electrostatic capacitance sensors or laser interferometers are used, variations in the spacing can be detected in a non-contact manner.

Additionally, in the optical projection system 10 shown in FIGS. 4 and 5, it would also be possible to insert piezoelectric elements between the respective outside protruding parts

36*a* and 36*b* and outside protruding parts 36*c* and 36*d* instead of the above-mentioned actuators 60*b* and 60*c*. The use of piezoelectric elements would also make it possible to omit the displacement detectors 64*a* and 64*b*. Furthermore, in cases where piezoelectric elements are used instead of the actuators 60*a* and 60*b*, the control device 66, as shown in FIG. 5, outputs driving voltages (which drive the piezoelectric elements) to the respective piezoelectric elements.

Figure 6:
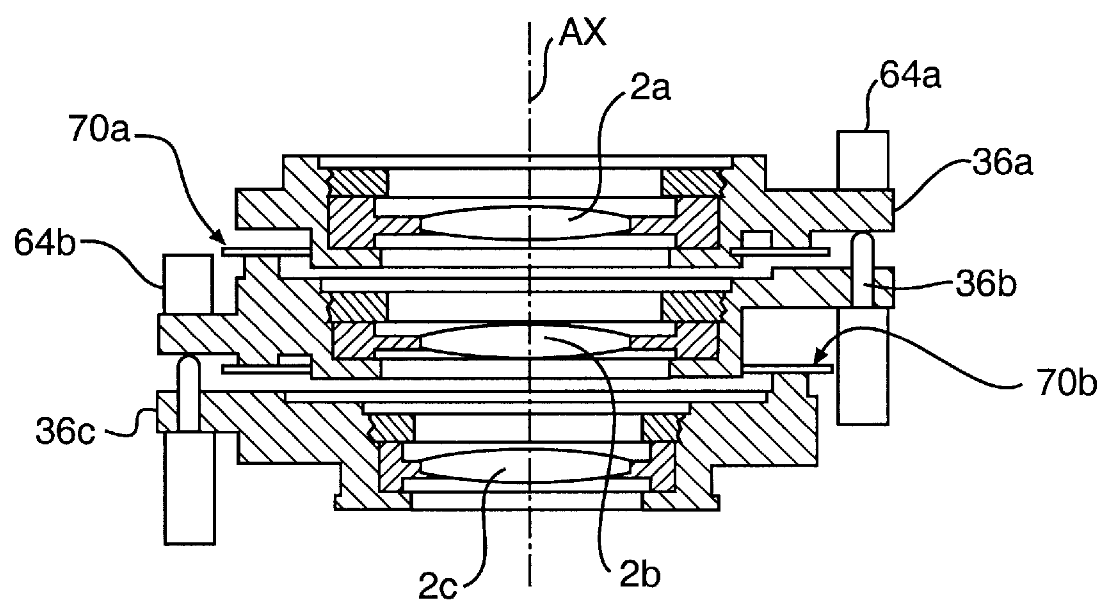
FIG. 6 is a schematic diagram which illustrates the construction of a movement mechanism for the split-type barrel in which an annular plate spring is installed between two individual barrels of the split-type barrel.
Figure 7:
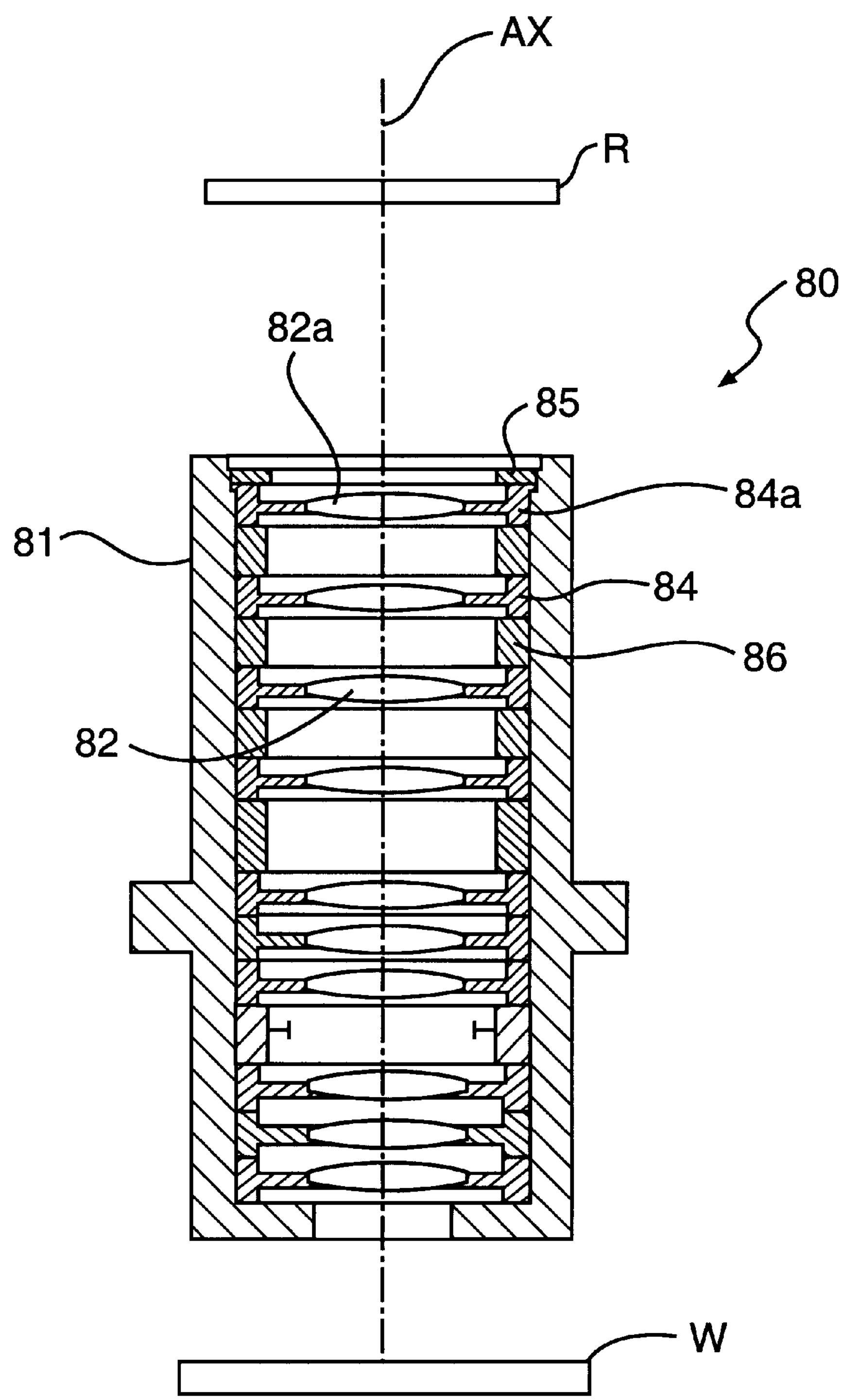
FIG. 7 is a schematic diagram which illustrates the construction of an optical projection system used in a conventional exposure projection apparatus.

FIG. 6 shows a structure in which the barrels 30*a* and 30*b* and barrels 30*b* and 30*c* are further respectively connected by annular (doughnut-shaped) plate springs 70*a* and 70*b* in the split-type barrel 30 equipped with a spacing adjustment mechanism containing the actuators 60*b* and 60*c* and displacement detectors 64*a* and 64*b* as shown in FIG. 4. These plate springs 70*a* and 70*b* have an internal diameter which is larger than the diameter of the lens cells 4. The upper surface of the plate spring 70*a* is fastened to portions of the undersurface of the outside protruding part 36*a* of the barrel 30*a* at 120° intervals in the same circumferential positions as the positions of the displacement detectors 64*a*. Furthermore, the undersurface of the plate spring 70*b* is fastened to portions of the upper surface of the outside protruding part 36*b* of the barrel 30*b* at 120° intervals in the same circumferential positions as the positions of the displacement detectors 64*b*.

Accordingly, for example, the upper surface of the plate spring 70*a* is connected with the barrel 30*a* at angular positions of 0°, 120°, and 240°, and the lower surface of the plate spring 70*a* is connected with the barrel 30*b* at angular positions of 60°, 180°, and 300°. In other words, the barrels 30*a* and 30*b* are coupled via the plate spring 70*a*. Similarly, for example, the upper surface of the plate spring 70*b* is connected with the barrel 30*b* at angular positions of 0°, 120°, and 240°, and the lower surface of the plate spring 70*b* is connected with the barrel 30*c* at angular positions of 60°, 180°, and 300°. In other words, the barrels 30*b* and 30*c* are coupled via the plate spring 70*b*.

As a result of the coupling of a plurality of barrels using the plate springs 70*a* and 70*b* as described above, the respective barrels are moved only in the direction of the optical axis AX, so that eccentricity of the barrels from the optical axis AX is constrained. Furthermore, by using the plate springs 70*a* and 70*b* as described above, it is possible to tilt the plurality of lens elements 2 without removing the respective centers of the lens elements 2 from the optical axis AX.

In the above embodiment, a step-and-repeat type exposure projection apparatus was described as an example. However, the present invention can also be applied to exposure projection apparatuses other than the step-and-repeat type. For example, the present invention can also be applied to the step-and-scan type exposure projection apparatus disclosed in U.S. Pat. No. 5,534,970.

Furthermore, in the above embodiment, three lens elements beginning with the lens element 2*a* closest to the object plane (reticle R) of the optical projection system 10 were selected, and the respective spacings (light path lengths) between these lens elements were adjusted in order to adjust Seidel's five aberrations, and especially the distortion Y, astigmatism MS, and coma CO, however, this was merely an example. The number and positions of the lens elements that are moved in order to adjust the three aberrations can be appropriately selected in accordance with the optical performance of the optical projection system 10 and the type and number of lens elements used. Furthermore, besides the lens element moving mechanisms described above, it would also be possible to seal the spaces between respective pairs of lens elements and to install a mechanism which alters the pressure of a gas inside the sealed spaces in the optical projection system 10. Such a mechanism would make it possible to adjust the magnification of the optical projection system 10 by altering the refractive index of the gas inside the sealed spaces.

What is claimed is:

1. An exposure apparatus comprising:

an illumination system which illuminates a mask with a light beam;

an optical projection system, projecting an image of a pattern formed on the mask onto a substrate, wherein the optical projection system includes a first barrel housing a plurality of optical elements;

at least three second barrels, each housing at least one optical element disposed between the mask and the first barrel, wherein coma, astigmatism, and distortion of the optical projection system can be adjusted; and a first optical element disposed between the substrate and the first barrel, capable of adjusting at least one of a spherical aberration and a curvature of field of the optical projection system.

2. An apparatus according to claim 1, wherein the first optical element is the optical element located closest to the substrate among the plurality of optical elements disposed between the mask and the substrate.

3. An apparatus according to claim 2, wherein the first optical element is an optical plate having whose curvature radius or thickness, or both, are adjusted in accordance with the spherical aberration or curvature of field, or both aberrations, of the optical projection system.

4. An apparatus according to claim 2, wherein the first optical element is fastened to the first barrel so that the first optical element is freely detachable.

5. An apparatus according to claim 2, wherein one of the at least three second barrels holds a second optical element that is closest to the mask among the plurality of optical elements disposed between the mask and the substrate.

6. An apparatus according to claim 1, wherein the optical elements held in the at least three second barrels are lined up along the optical axis of the projection system.

7. An apparatus according to claim 1, wherein the optical system includes spacers which are respectively disposed between pairs of adjacent barrels among the first barrel and the at least three second barrels, and the optical elements disposed between the mask and the first barrel are moved by changing the spacers.

8. An apparatus according to claim 7, wherein pairs of adjacent barrels among the at least three second barrels are respectively coupled to each other by screw members, and the spacers are washers which have cut-outs, and which are mounted on the screw members from the side.

9. An apparatus according to claim 1, wherein the optical projection system has a driving mechanism which moves the at least three second barrels along the optical axis of the optical projection system relative to the first barrel.

10. An apparatus according to claim 9, wherein the driving mechanism includes piezoelectric elements which are respectively disposed between pairs of adjacent barrels among the at least three second barrels.

11. An apparatus according to claim 9, wherein optical projection system includes plate springs which are respectively disposed between pairs of adjacent barrels among the at least three second barrels so that the second barrels can be moved in the direction of the optical axis without causing any shift of the three or more second barrels in the direction perpendicular to the optical axis.

12. An optical projection apparatus which is used in an exposure apparatus in which a pattern formed on a mask is transferred onto a substrate, this optical projection apparatus comprising:

a first barrel which holds a plurality of optical elements;

at least three second barrels which are moved relative to the first barrel so that the coma, astigmatism, and distortion of the optical projection system can be adjusted, each of the above-mentioned second barrels holding at least one optical element disposed between the mask and the first barrel; and an optical device which is disposed between the substrate and the above-mentioned first barrel, so that the spherical aberration or curvature of field, or both, are adjusted.

13. An exposure apparatus which exposes a second object with a light beam irradiated on a first object through a projection optical system having a first plane where the first object is arranged and a second plane where the second object is arranged, comprising:

a first barrel, having a plurality of optical elements, disposed between the first and second planes;

a plurality of second barrels, each housing at least one optical element, disposed between the first plane and the first barrel;

a plurality of actuators provided for the plurality of second barrels to chance intervals between optical elements, wherein coma, astigmatism and distortion of the projection optical system can be adjusted; and an optical plate disposed between the first barrel and the second plane to adjust spherical aberration or curvature of field of the projection optical system.

14. An apparatus according to claim 13, wherein said optical plate is capable of adjusting both of spherical aberration and curvature of field.

15. An apparatus according to claim 13, wherein each of said plurality of second barrels is connected with at least one of said plurality of actuators to relatively move said plurality of second barrels.

16. An apparatus according to claim 13, wherein said plurality of optical elements of said first barrel includes refraction elements.

17. An apparatus according to claim 16, wherein said at least one optical element in each of said plurality of second barrel includes a refraction element.

18. A method of exposing a second object with a light beam irradiated on a first object through a projection optical system, comprising:

moving first optical elements disposed between the first object and a first barrel having second optical elements by actuators provided for second barrels, each housing at least one of the first optical elements, to adjust coma, astigmatism and distortion of the projection optical system;

adjusting at least one of spherical aberration and curvature of field of the projection optical system by an optical plate disposed between the first barrel and the second object; and projecting the light beam from the first object on the second object through the first and second optical elements and the optical plate.

19. A method according to claim 18, wherein both of spherical aberration and curvature of field are adjustable by said optical plate.

20. A microdevice manufacturing method comprising a step of transferring a device pattern onto a workpiece using a method as defined in claim 18.

21. An exposure apparatus which exposes a second object through a projection optical system, with a light beam irradiated on a first object, comprising:

a first device, having a plurality of optical elements, provided in the projection optical system;

a plurality of second devices, each holding at least one optical element, arranged at the first object side with respect to the first device;

a plurality of actuators provided for the plurality of the second devices to change intervals between optical elements, wherein at least three optical properties of the projection optical system can be adjusted; and an optical plate provided in the projection optical system to adjust at least one of spherical aberration and curvature of field of the projection optical system.

22. An apparatus according to claim 21, wherein said at least three optical properties include aberration of said projection optical system.

23. A method for making an exposure apparatus which exposes a second object through a projection optical system, with a light beam irradiated on a first object, comprising:

providing a first device, having a plurality of optical elements, put in the projection optical system;

providing a plurality of second devices, each holding at least one optical element, arranged at the first object side with respect to the first device;

providing a plurality of actuators to change intervals between optical elements of the plurality of the second devices so that at least three optical properties of the projection optical system can be adjusted; and providing an optical plate to adjust at least one of spherical aberration and curvature of field of the projection optical system.

* * * * *